(12) United States Patent
Anderson et al.

(10) Patent No.: US 7,547,947 B2
(45) Date of Patent: Jun. 16, 2009

(54) SRAM CELL

(75) Inventors: Brent A. Anderson, Jericho, VT (US);
Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 597 days.

(21) Appl. No.: 11/164,218

(22) Filed: Nov. 15, 2005

(65) Prior Publication Data

US 2007/0108528 A1 May 17, 2007

(51) Int. Cl.
*H01L 21/00* (2006.01)
*H01L 29/10* (2006.01)
*H01L 23/62* (2006.01)

(52) U.S. Cl. .................... 257/369; 257/66; 257/903; 438/157

(58) Field of Classification Search ................ 257/369, 257/67, 66, 903; 438/157, 155
See application file for complete search history.

(56) References Cited

U.S. PATENT DOCUMENTS

| | | | |
|---|---|---|---|
| 6,642,090 B1 | 11/2003 | Fried et al. | |
| 6,696,330 B2 | 2/2004 | Forbes et al. | |
| 6,720,619 B1 | 4/2004 | Chen et al. | |
| 6,838,322 B2 | 1/2005 | Pham et al. | |
| 6,867,460 B1 | 3/2005 | Anderson et al. | |
| 7,023,056 B2 * | 4/2006 | Liaw | 257/369 |
| 7,164,175 B2 * | 1/2007 | Kawasaki et al. | 257/401 |
| 7,172,943 B2 * | 2/2007 | Yeo et al. | 438/300 |
| 7,233,032 B2 * | 6/2007 | Liaw | 257/202 |
| 2004/0150029 A1 | 8/2004 | Lee | |
| 2004/0259295 A1 | 12/2004 | Tomiye et al. | |
| 2004/0266076 A1 * | 12/2004 | Doris et al. | 438/157 |
| 2005/0026377 A1 | 2/2005 | Kawasaki et al. | |
| 2005/0035415 A1 | 2/2005 | Yeo et al. | |
| 2005/0073060 A1 | 4/2005 | Datta et al. | |
| 2005/0111251 A1 | 5/2005 | Liaw | |
| 2005/0124095 A1 | 6/2005 | Liaw | |

* cited by examiner

*Primary Examiner*—Howard Weiss
*Assistant Examiner*—Steven H Rao
(74) *Attorney, Agent, or Firm*—Gibb I.P. Law Firm, LLC; Richard M. Kotulak, Esq

(57) ABSTRACT

Disclosed is an SRAM cell on an SOI, bulk or HOT wafer with two pass-gate n-FETs, two pull-up p-FETs and two pull-down n-FETs and the associated methods of making the SRAM cell. The pass-gate FETs and pull-down FETs are non-planar fully depleted finFETs or trigate FETs. The pull-down FETs comprise non-planar partially depleted three-gated FETs having a greater channel width and a greater gate length and, thus, a greater drive current relative to the pass-gate and pull-up FETs. Additionally, for optimal electron mobility and hole mobility, respectively, the channels of the n-FETs and p-FETs can comprise semiconductors with different crystalline orientations.

17 Claims, 11 Drawing Sheets

ABSTRACT# SRAM CELL

BACKGROUND OF THE INVENTION

1. Field of the Invention

The invention generally relates to the field of semiconductor integrated circuit design and, more particularly, to non-planar static random access memory (SRAM) cell design.

2. Description of the Related Art

Integrated circuit design decisions are often driven by device scalability and manufacturing efficiency. For example, size reduction of single-gate planar metal oxide semiconductor field effect transistors (MOSFETs) often results in reduced drive current because the width of the device is associated with the drive. In response, multi-gated non-planar transistors, such as double-gated FETs (e.g., fin-type FETs (finFETs)) or trigate FETs, were developed to provide scaled devices with faster drive currents and reduced short channel effects.

FinFETs are non-planar transistors in which a fully depleted channel region is formed in the center of a thin semiconductor fin with source and drain regions in the opposing ends of the fin adjacent to the channel region. Gates are formed each side of the thin fin in an area corresponding to the channel region. The effective fin width is determined by the fin height (e.g., short wide fins can cause partial depletion of a channel). For a double-gated fin-FET, a fin thickness of approximately one-fourth the length of the gate (or less) can ensure suppression of deleterious short-channel effects, such as variability in threshold voltage and excessive drain leakage currents. Additionally, the effective channel width of a fin-FET device can be increased by using multiple fins.

Trigate MOSFETs have a similar structure to that of fin-FETs; however, the fin width and height are approximately the same so that gates can be formed on three sides of the channel, including the top surface and the opposing sidewalls. The height to width ratio is generally in the range of 3:2 to 2:3 so that the channel will generally remain fully depleted and the three-dimensional field effects of a trigate MOSFET will give greater drive current and improved short-channel characteristics over a planar transistor. As with finFETs, the effective channel width of a trigate MOSFET can be increased by using multiple fins. For a detail discussion of the structural differences between dual-gate finFETs and tri-gate MOSFETs see "Dual-gate (finFET) and Tri-Gate MOSFETs: Simulation and Design" by A Breed and K. P. Roenker, Semiconductor Device Research Symposium, 2003, pages 150-151, December 2003 (incorporated herein by reference).

Recently, static random access memory (SRAM) cells (e.g., 6T-SRAM cells having two pass-gate transistors, two pull-up transistors and two pull-down transistors) have incorporated such non-planar multi-gate FETs. Such SRAM cells can be formed, for example, using silicon-on-insulator (SOI) wafers, bulk wafers or hybrid orientation wafers. However, due to the conventional lithographic techniques used to pattern the fins (regardless of the type of wafer used), it is difficult to fit the multiple fins required to achieve an effective width and, thereby, sufficient drive current for non-planar multi-gate SRAM cells, and particularly, for the pull-down FETs of SRAM cells, in the same space as a planar SRAM cell. Additionally, frequency doubling of fin pitch is not easily achieved using current state of the art lithographic technology, and thus, trigate or finFET SRAM cells may be compromised for either density or performance. Therefore, there is a need for a dense high-speed non-planar multi-gate SRAM cell in which drive current of the pull-down FETs can be maintained or increased without a corresponding increase in deleterious short-channel effects despite a reduction in cell size.

SUMMARY OF THE INVENTION

In view of the foregoing, embodiments of the invention provide a non-planar six transistor (6-T) static random access memory (SRAM) cell with two first-type (e.g., n-type) pass-gate transistors (i.e., first transistors), two second-type (e.g., p-type) pull-up transistors (i.e., second transistors) and two first-type (e.g., n-type) pull-down transistors (i.e., third transistors) all formed on a silicon-on-insulator (SOI) wafer, a bulk wafer, or a hybrid orientation (HOT) wafer. The pass-gate transistors and the pull-up transistors can comprise non-planar fully depleted multi-gated FETs (e.g., fully depleted fin-type field effect transistors (finFETs) or fully depleted trigate FETs). The pull-down FETs on the other hand can comprise wider three-gated partially depleted FETs with greater effective widths for greater current carrying capability.

Each of the pull-down FETs has three gates (i.e., third gates). The gates are positioned adjacent to the opposing sidewalls and top surface of the channel (i.e., third channel) of the pull-down FETs. The pull-down FET channels are approximately the same height but wider (e.g., approximately 1.5 times wider) than the channels (i.e., the first channels and the second channels, respectively) of the pass-gate and pull-down FETs. Specifically, the pull-down FET channels have a predetermined width necessary to achieve a predetermined height-to-width ratio that results in the channel being partially depleted.

Furthermore, the gates of the pull-down FETs are longer than the gates (i.e., the first gates and the second gates, respectively) of the pass-gate and pull-up FETs. Specifically, the pull-down FET gates have a predetermined length that is necessary to achieve a predetermined channel width-to-gate length ratio that is sufficient to suppress short-channel effects and to increase the drive current of the pull-down transistor relative to that of the pass-gate transistor and the pull-up transistor.

As mentioned above, the pass-gate and pull-down FETs comprise first-type FETs (e.g., n-FETs) and the pull-up FETs comprise second-type FETs (e.g., p-FETs). Thus, the fin and, particularly, the channel of the pass-gate and pull-up FETs can comprise a semiconductor (e.g., silicon) material with a first crystalline orientation that is optimal for the mobility of electrons in an n-type transistor (e.g., {100} orientation). Similarly, the fin and, particularly, the channel of the pull-up FETs can comprise the same semiconductor material with a different crystalline orientation (i.e., a second crystalline orientation) that is optimal for the mobility of holes in a p-type transistor (e.g., {110} orientation). For example, on a SOI wafer or a bulk wafer, the fins of the pass-gate FETs and pull-down FETs can be positioned at an angle (e.g., of approximately 45 degrees) relative to the fins of the pull-up FETs such that the different crystalline orientations are achieved. Alternatively, the different orientations can be achieved by forming the various FETs on a hybrid orientation wafer.

Lastly, if the SRAM cell comprises either a bulk wafer or a hybrid orientation wafer and the pull-down n-FETs comprise a p-type well below the channel, then to further control the threshold voltage of the pull-down n-FETs and to further suppress the short-channel effects an electric bias can be applied to the p-type well (e.g, via a contact to the p-well).

Generally, embodiments of the method of forming the above-described SRAM cell comprise simultaneously forming first semiconductor fins, second semiconductor fins and third semiconductor fins on an SOI, bulk or HOT wafer, using known methods (e.g., lithographic or sidewall image transfer techniques). These fins are to be used to form first transistors, at second transistors and third transistors, respectively. For example, two first semiconductor fins may be used to form two n-type pass-gate transistors (i.e., two first transistors), two second semiconductor fins may be used to form two p-type pull-up transistors (i.e., two second transistors) and two third semiconductor fins may be used to form two n-type pull-down transistors (i.e., two third transistors).

All of the fins are formed with approximately the same height, but the third semiconductor fin can be formed wider (e.g., greater than approximately 1.5 times wider) than the first semiconductor fin and the second semiconductor fin. Specifically, the third semiconductor fins can be formed with a predetermined width necessary to achieve a predetermined height-to-width ratio that results in a partial depletion of the channels of the third transistors. Both the first semiconductor fins and the second semiconductor fins can be formed with a second predetermined height-to-width ratio that is sufficient to form fully depleted finFETs. Alternatively, both the first semiconductor fins and the second semiconductor fins can be formed with a third predetermined height-to-width ratio that is sufficient to form fully depleted trigate FETs.

Furthermore, the first semiconductor fins and the third semiconductor fins can be formed with a first crystalline orientation. For example, if the pass-gate and pull-down transistors being formed are n-type transistors, the first and third semiconductor fins can be formed such that they have a first crystalline orientation optimal for electron mobility (e.g., {100} orientation). The second semiconductor fins can be formed with a second crystalline orientation. For example, if the pull-down transistors being formed are p-type transistors, the second semiconductor fin can be formed with a second crystalline orientation optimal for hole mobility (e.g., {110} orientation). The different crystalline orientations can be achieved if a bulk wafer or a silicon-on-insulator wafer is used to form the SRAM cell, by forming the first semiconductor fins and the third semiconductor fins at a predetermined angle (e.g., approximately a 45 degree angle) relative to the second semiconductor fins. Alternatively, a hybrid orientation wafer can be used.

After forming the semiconductor fins, gates (i.e., first gates, second gates and third gates) can be formed adjacent the corresponding fins. If the pass-gate and pull-up FETs are formed as finFETs, then gates (i.e., first and second gates, respectively) are formed on the opposing sidewalls of the first and second semiconductor fins. If the pass-gate and pull-up FETs are formed as trigate FETs, the gates (i.e., first and second gates, respectively) are formed on the opposing sidewalls and top surfaces of the first and second semiconductor fin. Additionally, regardless of whether the pass-gate and pull-up FETs are finFETs or trigate FETs, at least three gates (i.e., third gates) are formed adjacent the top surface and opposing sidewalls of the third semiconductor fins. The third gates are formed longer than the first gates and the second gates and with a predetermined fin (or channel) width-to-gate length ratio so as suppress short-channel effects caused by the partial depletion and to increase a drive current of the pull-down FETs relative to that of the pass-gate and pull-up FETs.

Once the gates are formed, additional processing may include forming source/drain extensions, forming halos, forming spacers, forming source/drain regions, depositing and planarizing a blanket dielectric layer, forming contacts to the gates, etc. Additionally, if the SRAM cell is formed with either a bulk wafer or a hybrid orientation wafer and p-wells are formed below the channel of the pull-down n-FETs, then contacts can also be formed to the p-wells so that an electrical bias can be applied to the p-wells in order to further control the threshold voltages of the pull-down n-FETs and to further suppress short-channel effects.

These and other aspects of embodiments of the invention will be better appreciated and understood when considered in conjunction with the following description and the accompanying drawings. It should be understood, however, that the following description, while indicating embodiments of the invention and numerous specific details thereof, is given by way of illustration and not of limitation. Many changes and modifications may be made within the scope of the embodiments of the invention without departing from the spirit thereof, and the invention includes all such modifications.

BRIEF DESCRIPTION OF THE DRAWINGS

The embodiments of the invention will be better understood from the following detailed description with reference to the drawings, in which.

DETAILED DESCRIPTION OF PREFERRED EMBODIMENTS OF THE INVENTION

Figure 1:
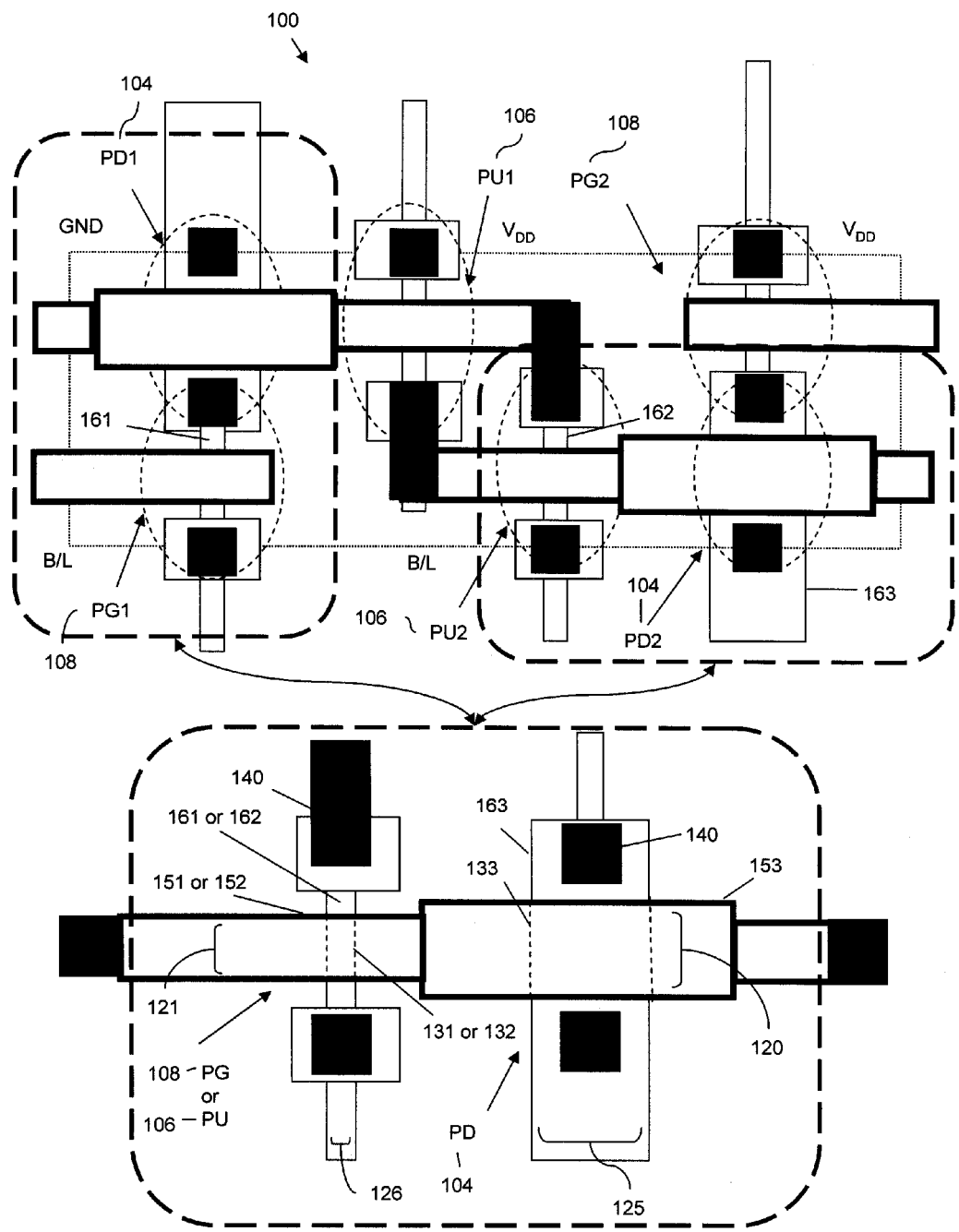
FIG. 1 illustrates a top view schematic diagram of an embodiment of a memory cell of the invention.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the invention.

As mentioned above, due to the conventional lithographic techniques used to pattern fins for non-planar SRAM cells (regardless of the type of wafer used, e.g., silicon-on-insulator (SOI) wafer, bulk wafer, or hybrid orientation (HOT) wafers), it is difficult to fit the multiple fins required to achieve an effective width and, thereby, sufficient drive current for the pull-down FETs of SRAM cells in the same space as in a planar SRAM cell. Additionally, frequency doubling of fin pitch is not easily achieved using current state of the art lithographic technology, and thus, trigate or finFET SRAM cells may be compromised for either density or performance. Therefore, there is a need for a dense high-speed non-planar multi-gate SRAM cell in which drive current of the pull-down FETs can be maintained or increased without a corresponding increase in deleterious short-channel effects despite a reduction in cell size.

Figure 2:
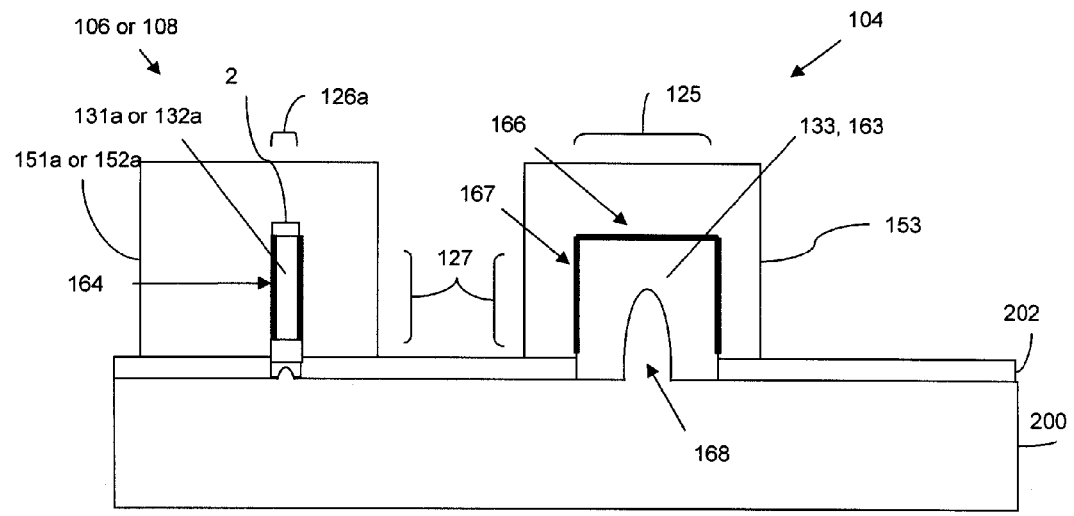
FIG. 2 illustrates a cross-section view schematic diagram of a portion of an embodiment of a memory cell of the invention.
Figure 3:
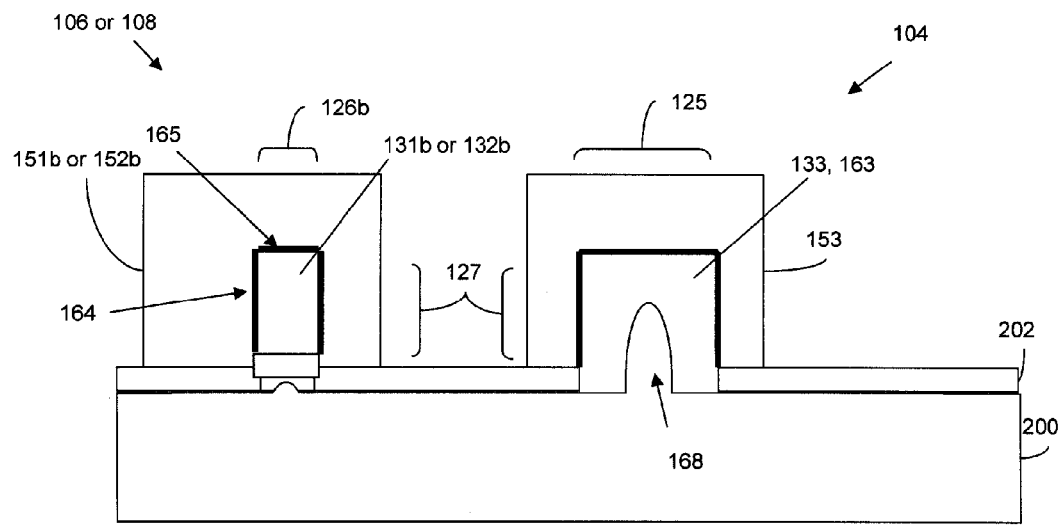
FIG. 3 illustrates a cross-section view schematic diagram of a portion of another embodiment of a memory cell of the invention.

Referring to FIG. 1, in view of the foregoing, embodiments of the invention provide a non-planar memory cell, such as a six transistor (6-T) static random access memory (SRAM) cell with two pass-gate field effect transistors (FETs) (i.e., first transistors) 108, two pull-up FETs (i.e., second transistors) 106 and two pull-down FETs (i.e., third transistors) 104. The SRAM cell 100 can further comprise a substrate 200, e.g., a silicon-on-insulator (SOI) wafer, a bulk wafer (as illustrated in FIGS. 2 and 3), or a hybrid orientation (HOT) wafer. The pass-gate FETs 108 and pull-down FETs 104 can comprise first-type FETs (e.g., n-FETs) and the pull-up FETs 106 can comprise second-type FETs (e.g., p-FETs). For illustration purposes, embodiments of the SRAM cell are described herein with the pass-gate FETs 108 and pull-down FETs 104 being n-FETs and with the pull-up FETs 106 being p-FETs. However, those skilled in the art will recognize that the embodiments of the SRAM cell can, alternatively, be formed with the pass-gate FETs 108 and pull-down FETs 104 being p-FETs and with the pull-up FETs 106 being n-FETs.

Furthermore, the pass-gate FETs 108 and the pull-up FETs 106 can each comprise non-planar fully depleted multi-gated FETs that are configured the same, e.g., as either finFETs or trigate FETs. FIGS. 2 and 3 show differently configured cross-section views of the exploded portion of FIG. 1 formed, for illustration purposes, on a bulk substrate 200. Specifically, FIGS. 2 and 3 illustrate a pull-down FET 104 adjacent to either a pass-gate 108 or pull-down FET 106. As illustrated in FIG. 2 in combination with FIG. 1, the pass-gate and pull-up transistors 106, 108 of an SRAM cell 100a can each comprise fin-type field effect transistors (finFETs). Specifically, each of the finFETs 108 and 106 can comprise a fully depleted channel 131a and 132a (i.e., first channel and second channel, respectively) in a center region of the corresponding thin semiconductor fin 161 and 162 (i.e., first fin and second fin, respectively). For each of the finFETs 108 and 106, there are two gates (i.e., first gates 151a and second gates 152a, respectively) positioned adjacent to the opposing sides 164 of the very thin fins 161 and 162. A nitride or oxide cap 2 can be positioned on the top surface of the fins 161 and 162. Specifically, the first gates 151a of the pass-gate finFETs 108 and the second gates 152a of the pull-up finFETs 106 are positioned adjacent to the channel regions 131a and 132a of the fins 161 and 162, respectively. Each of the finFETs 108 and 106 has the same channel width 126a and the same gate length 121. More particularly, the channel width 126a is favorably approximately one-fourth (or less) the gate length 121 to ensure suppression of deleterious short-channel effects, such as variability in threshold voltage and excessive drain leakage currents.

Alternatively, as illustrated in FIG. 3 in combination with FIG. 1, the pass-gate and pull-up transistors 108 and 106 of an SRAM cell can comprise trigate FETs. Specifically, each of the trigate FETs can comprise a similar structure as that of the finFETs described above; however, the fin widths 126b and heights 127 are approximately equal. Thus, first 151b and second 152b gates can be formed on three sides (including the top surface 165 and the opposing sidewalls 164) of the first and second channels 131b and 132b of the pass-gate 108 and pull-up trigate FETs 106, respectively. As long as the height 127 of the first and second channels 131b and 132b is generally not less than channel width 126b, the channels 131b and 132b will remain fully depleted and the three-dimensional field effects of a trigate MOSFET will give greater drive current and improved short-channel characteristics over a planar transistor.

The pull-down FETs 104 on the other hand can comprise wider three-gated non-planar FETs with greater effective fin widths 125 for greater current carrying capability. Specifically, referring to FIG. 1, including the exploded view of a pull-down FET 104 adjacent to either a pull-up FET 106 or a pass-gate FET 108, in combination with FIGS. 2-3, the height 127 of the semiconductor fins 163 of the pull-down transistors 104 is approximately equal to that of the semiconductor fins 161 and 162, respectively, for the pass-gate 108 and pull-up 106 FETs. However, the third semiconductor fins 163 are significantly wider (e.g., greater than approximately 1.5 times wider) than the first and second fins 161 and 162. By increasing the width 125 of the third semiconductor fins 161 for the pull-down FETs 104, and more particularly, by increasing the width 125 of the channel 133 (i.e., third channel), and by positioning gates 153 on the top surface 166 and on the opposing sidewalls 167 of the third channel 133, the current carrying capability (i.e., drive current) of the pull-down FETs 104 (i.e., third transistors) is increased relative to that of the pull-up FETs 106 and pass-gate FETs 108. However, this increased channel width 125 changes the channel height-to-width ratio (i.e., height 127 to width 125 ratio) such that the channel 133 becomes partially depleted (see neutral region 168) causing increased short-channel effects, such as variability in threshold voltage and excessive drain leakage currents. Particularly, as fin width 125 increases relative to height 127, the threshold voltage (i.e., the voltage required to turn on the transistor) begins to decrease and leakage current increases. Increases in leakage current may have a significant deleterious effect on total power consumption of the SRAM cell and the product using the SRAM cell. Therefore, by also increasing the gate length 120 (see FIG. 1) for the pull-down FETs 104 relative to the gate length 121 of the pull-up or pass-gate FETS 106 and 108 and more particularly, by forming the pull-down FETs 104 with a predetermined channel (fin) width-to-gate length ratio (width 125 to gate length 120 ratio), better power management is achieved across the SRAM cell 100 allowing for improved short-channel effects and an increase in drive current for the pull-down FETs 104. Thus, greater effective fin width can be achieved with less overall space requirements than if multiple fins are used.

Figure 4:
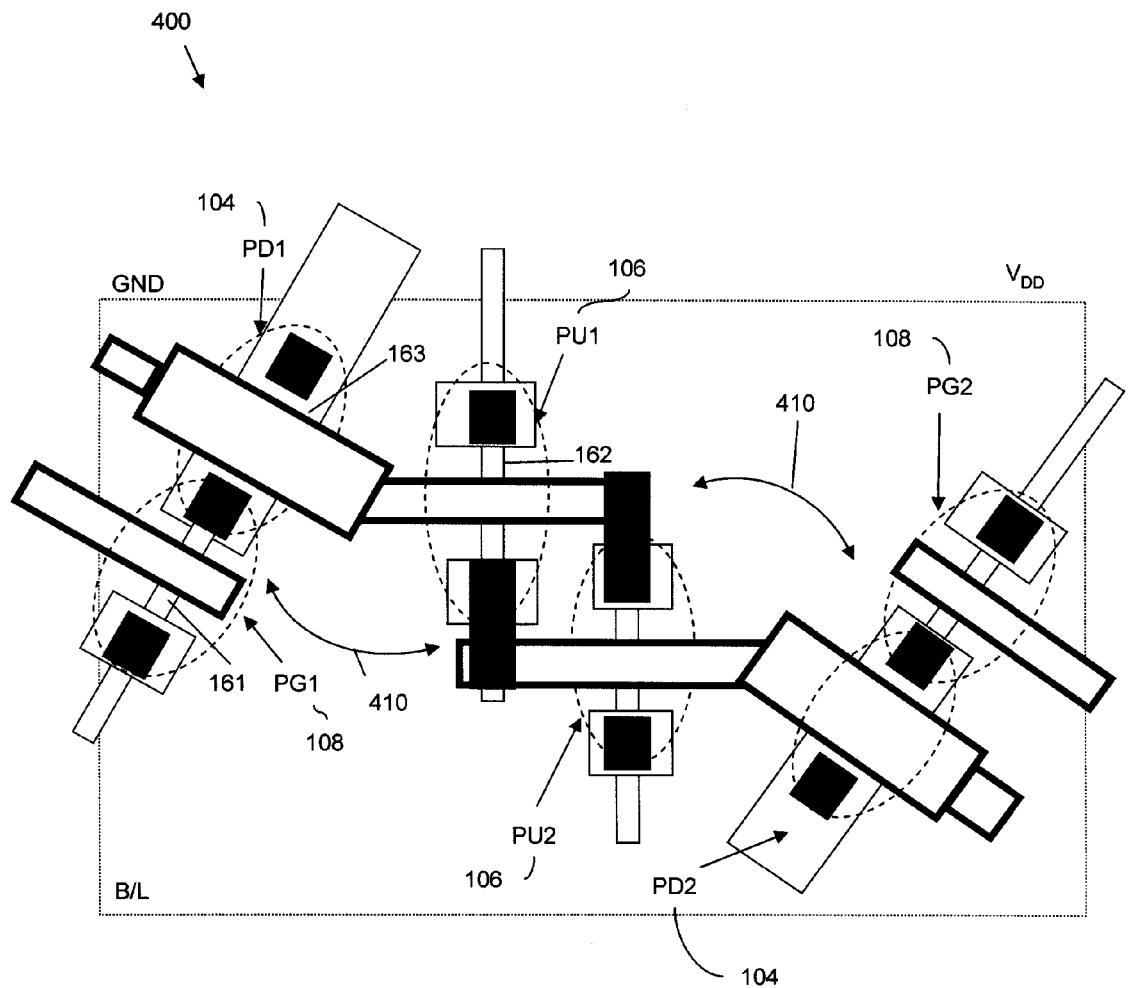
FIG. 4 illustrates a top view schematic diagram of another embodiment of a memory cell of the invention.

As mentioned above, the pass-gate 108 and pull-down FETs 104 comprise first-type FETs (e.g., n-FETs) and the pull-up FETs comprise second-type FETs (e.g., p-FETs). Thus, the fins (i.e., first and third fins 161 and 163) and, particularly, the channels (i.e., first and third channels 131 and 133) of the pass-gate 108 and pull-up FETs 104 can comprise a semiconductor material with a first crystalline orientation that is optimal for the mobility of electrons in an n-type transistor (e.g., {100} orientation). Similarly, the second channel 132 of the p-type pull-up transistor 106 can comprise the same semiconductor material with different orientation (i.e., a second crystalline orientation) that is optimal for the mobility of holes in a p-type transistor (e.g., {110} orientation). For example, referring to the exemplary SRAM cell 400 of FIG. 4, on a SOI wafer or a bulk wafer, the first and third semiconductor fins 161 and 163 of the pass-gate FETs 108 and pull-down FETs 104, respectively, can be positioned at an angle 410 (e.g., of approximately 45 degrees) relative to the second semiconductor fins 162 of the pull-up FETs 104 such that the different crystalline orientations are achieved. Alternatively, the different orientations can be achieved by forming SRAM cell and it various FETs on a hybrid orientation wafer.

Figure 5:
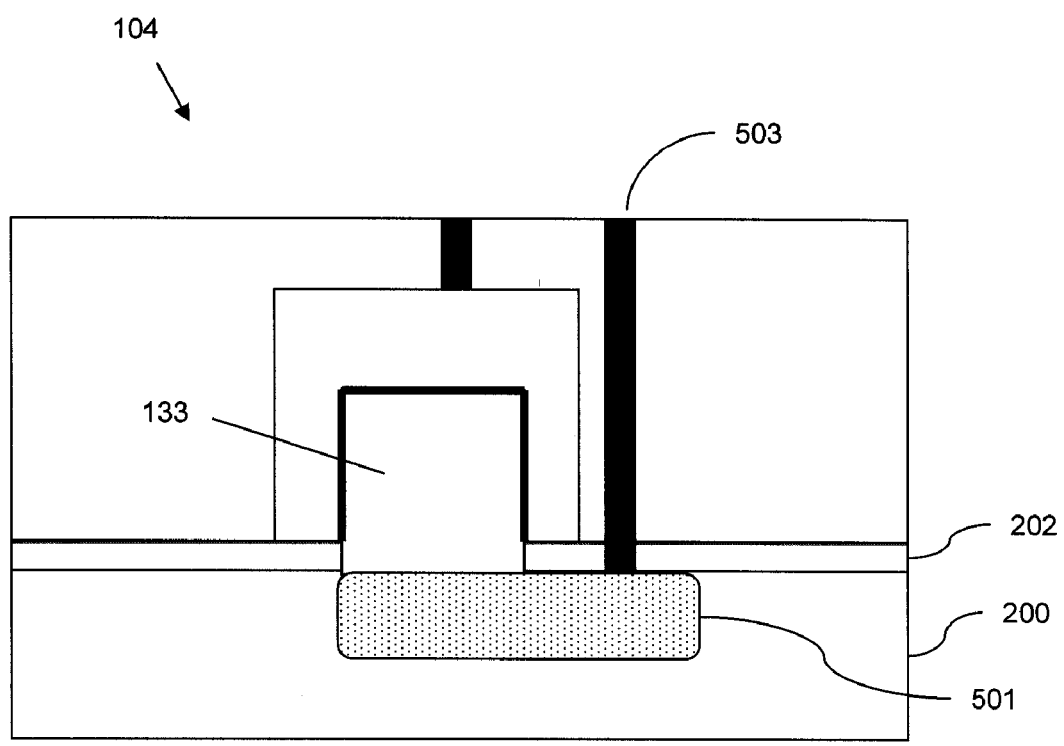
FIG. 5 illustrates a cross-section view schematic diagram of a portion of another embodiment of a memory cell of the invention.

Lastly, referring to FIG. 5, if the SRAM cell is formed with either a bulk p-type silicon wafer or a hybrid orientation wafer with a p-type silicon substrate and p-type wells 501 are formed in the substrate 200 below the channel 133 of the pull-down FETs 104, then to further control the threshold voltage of the n-type pull-down FETs 104 and to further suppress the short-channel effects an electric bias can be applied to the p-type wells 501, e.g., via contacts 503).

Figure 6:
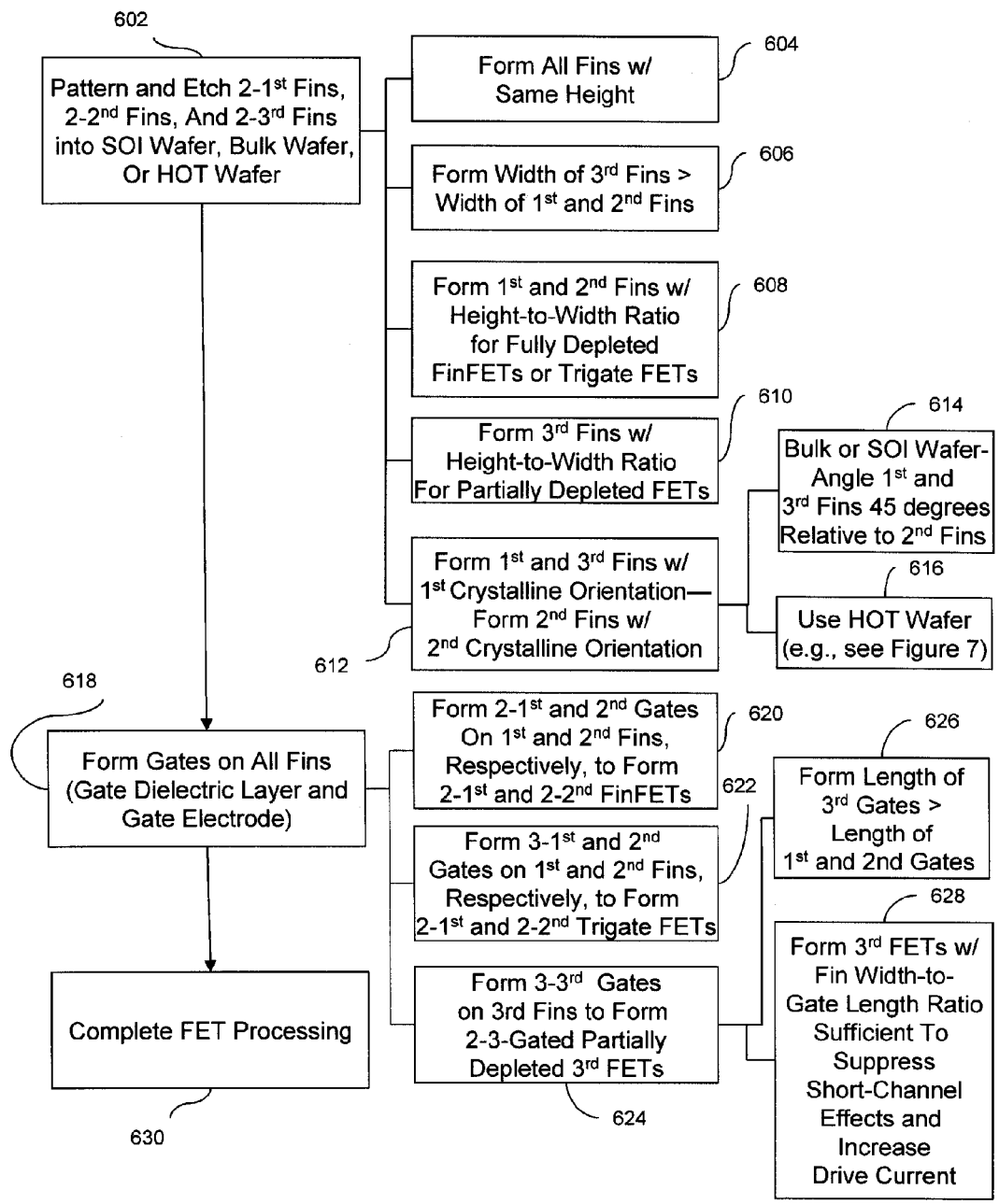
FIG. 6 is a flow diagram illustrating an embodiment of the method of forming the memory cell of FIG. 1.
Figure 7:
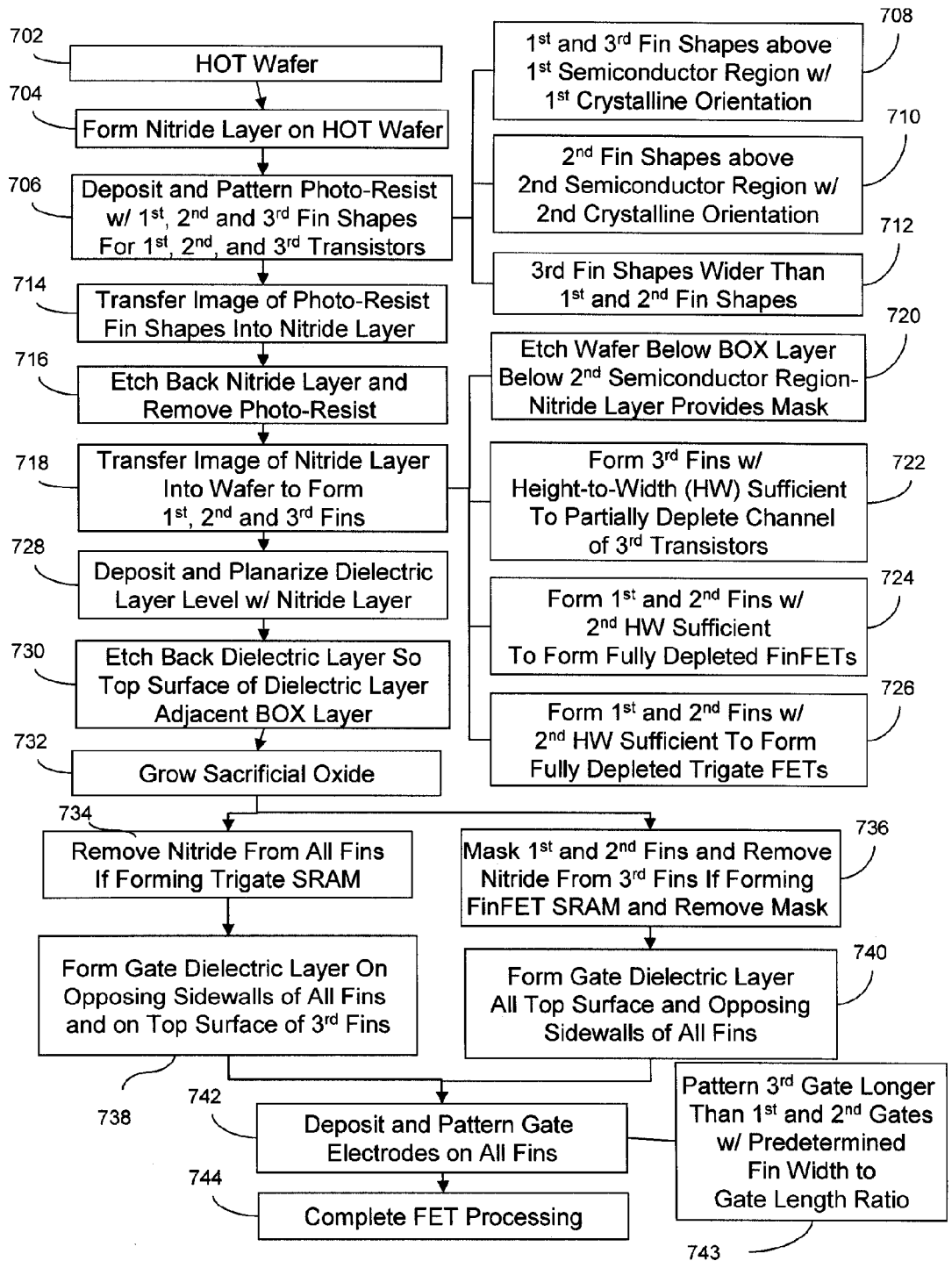
FIG. 7 is a flow diagram illustrating another embodiment of a method of forming the memory cell of FIG. 1.

Referring to FIG. 6 in combination with FIGS. 1-5, generally embodiments of the method of forming the above-described SRAM cells comprise simultaneously forming at first semiconductor fins, second semiconductor fins and third semiconductor fins on a substrate 200 comprising an SOI, bulk or HOT wafer in order to form first transistors 108, second transistors 106 and third transistors 104, respectively. For example, two first semiconductor fins 161 may be used to form two n-type pass-gate transistors 108, two second semiconductor fins 162 may be used to form two p-type pull-up transistors 106 and two third semiconductor fins 163 may be used to form two n-type pull-down transistors 104. Specifically, fins 161-163 are patterned (e.g., by lithographic or sidewall image transfer techniques) and etched (e.g., by directional etch) (602).

All of the fins 161, 162, 163 are formed with approximately the same height 127 (604), but the third semiconductor fin 163 is formed wider (e.g., greater than approximately 1.5 times wider) than the first semiconductor fin 161 and the second semiconductor fin 162 (606). The third semiconductor fin 163 is, specifically, formed with a predetermined width 125 necessary to achieve a predetermined height 127-to-width 125 ratio that results in a partial depletion of the third channel 133 of the third transistor 104 (e.g., as illustrated by charge-neutral region 168 of FIGS. 2-3) (610). Both the first semiconductor fin 161 and the second semiconductor fin 162 can be formed with a second predetermined height 127-to-width 126a ratio that is sufficient to form a fully depleted fin-type field effect transistor, as illustrated in FIG. 2 (609). Alternatively, both the first semiconductor fin 161 and the second semiconductor fin 162 can be formed with a third predetermined height 127-to-width 126b ratio that is sufficient to form a fully depleted trigate field effect transistor, as illustrated in FIG. 3 (608). Note that for illustration purposes the structures of FIGS. 2 and 3 are shown formed using a bulk substrate; however, those skilled in the art will recognize that the SRAM cell of the invention may also be formed, as described above, using conventional processing techniques for SOI or HOT wafers.

Additionally, as mentioned above, the pass-gate 108 and pull-down FETs 104 are to be formed as first-type FETs (e.g., n-FETs) and the pull-up FETs are to be formed as second-type FETs (e.g., p-FETs). Thus, the first and third semiconductor fins 161 and 163 can be formed with a first crystalline orientation (612). For example, if the first and third transistors 108, 104 are to be formed as n-FETs, the first and third semiconductor fins 161, 163 can be formed with a first crystalline orientation optimal for electron mobility (e.g., {100} orientation). Similarly, the second semiconductor fin 162 can be formed with a second crystalline orientation (612). For example, if the second transistor 106 is to be formed as a p-FET, the second semiconductor fin 162 can be formed with a second crystalline orientation optimal for hole mobility (e.g., {110} orientation). The different crystalline orientations can be achieved if a bulk wafer or a silicon-on-insulator wafer is used to form the SRAM cell, by forming the first and third semiconductor fins 161 and 163 at a predetermined angle 410 (e.g., approximately a 45 degree angle) relative to the second semiconductor fins 162 (614, see FIG. 4). Alternatively, a hybrid orientation wafer can be used (616).

After forming the semiconductor fins 161, 162, 163, gates, including gate dielectric layers and gate electrodes, are formed adjacent the corresponding fins (618). Specifically, if the pass-gate and pull-down FETs are being formed as finFETs (see FIG. 2), then first gates 151a are formed on the opposing sidewalls of the first semiconductor fins 161 and second gates 152a are formed on the opposing sidewalls of the second semiconductor fins 162 (620). Alternatively, if the pass-gate and pull-up FETs are being formed as trigate FETs, then first and second gates 151b and 152b are formed on the opposing sidewalls and top surface of the corresponding semiconductor fins 161 and 162 (622). Additionally, regardless of whether the pass-gate and pull-up FETs are formed as finFETs or trigate FETs, three third gates 153 are formed adjacent the top surface 166 and opposing sidewalls 167 of the third semiconductor fin 163 (624). The third gates 153 are formed longer than the first gates 151 and the second gates 152 (626) and with a predetermined fin (or channel) width-to-gate length ratio so as suppress short-channel effects caused by the partial depletion and to increase a drive current of the third transistor relative to that of the first transistor and the second transistor (628).

Once the gates are formed, additional processing, such as forming source/drain extensions, forming halos, forming spacers, forming source/drain regions, depositing and planarizing a blanket dielectric layer, forming contacts to the gates, etc. may be performed (630). Additionally, if either a bulk wafer or a hybrid orientation wafer is used to form the SRAM cell and p-wells are formed below the channels of the pull-down n-FETs, then contacts can also be formed to the p-wells so that an electrical bias can be applied to the p-wells in order to further control the threshold voltages of the pull-down n-FETs and to further suppress short-channel effects.

Figure 8:
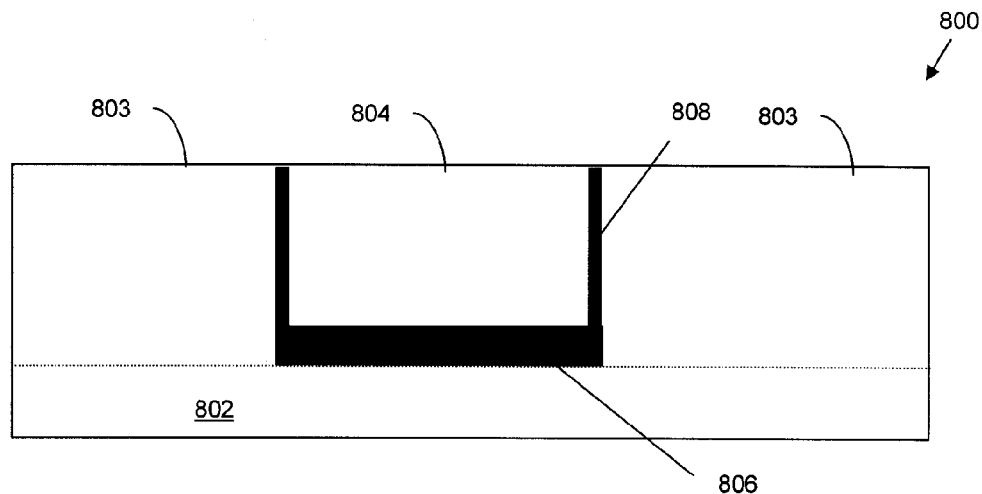
FIGS. 8-17 are schematic diagrams illustrating a portion of a partially completed memory cell of FIG. 1.

The following illustrates a more detailed embodiment of the method of forming an SRAM cell, as in FIG. 1, that specifically incorporates the use of a hybrid orientation (HOT) wafer 800 (702, see FIG. 8). The wafer 800 comprises a semiconductor substrate 802 with a first crystalline orientation. On the substrate 802 are first semiconductor regions 803 with the same first crystalline orientation (e.g., a {100} oriented silicon having optimal electron mobility for nFETs) and second semiconductor regions 804 with a different second crystalline orientation (e.g., a {110} oriented silicon having optimal hole mobility for pFETs). The second semiconductor regions 804 are isolated from the substrate 802 by a buried oxide layer 806 (e.g, a silicon dioxide layer) and from the first semiconductor regions 803 by an isolation film 808. A blanket hard mask (e.g., a nitride layer) 902 is formed on the HOT wafer 800 (704).

Figure 9:
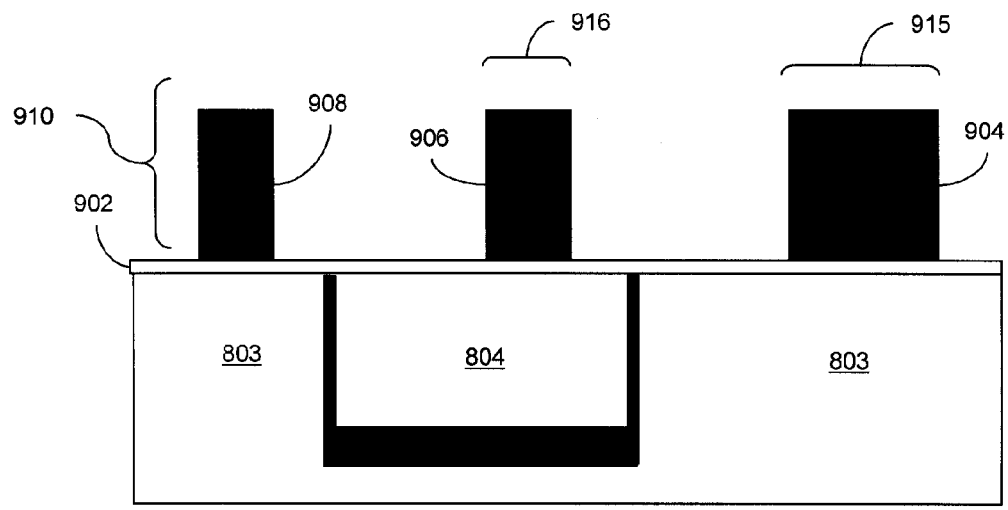
Figure 10:
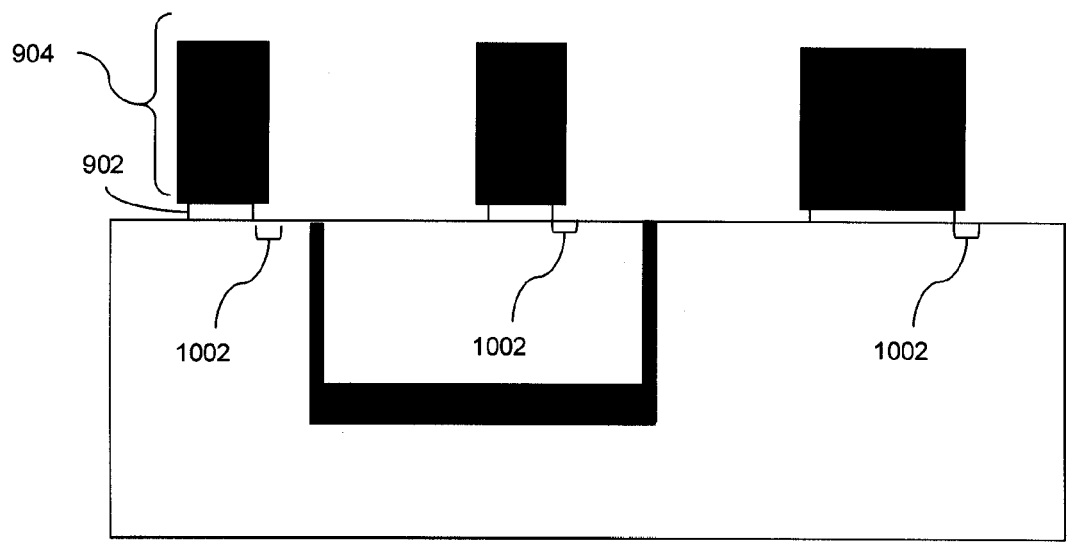
Figure 11:
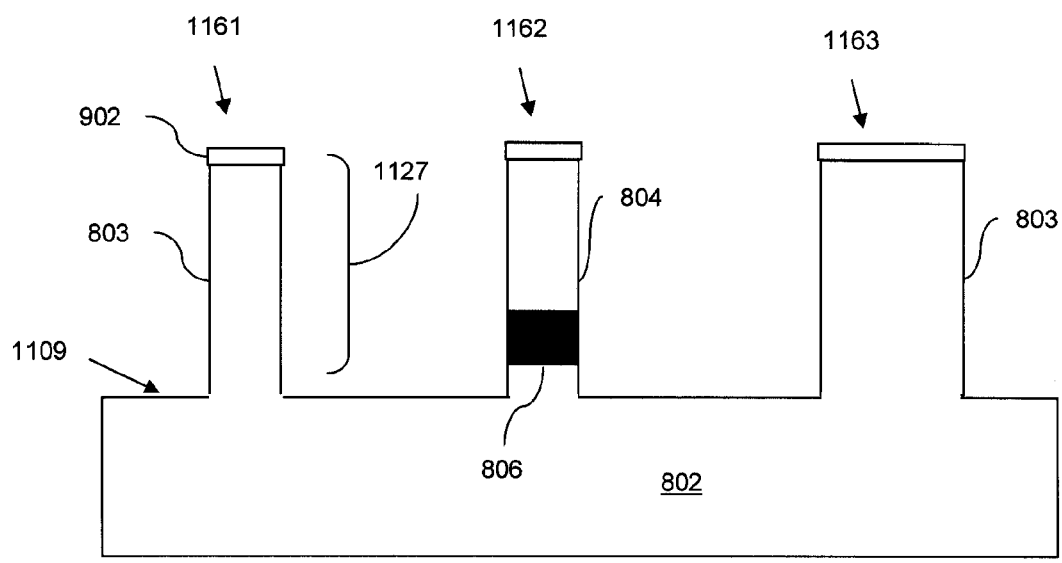

A photo-resist layer 910 is deposited and a lithographically patterned with fin shapes 908, 906, 904 for the first, second and third transistors (i.e., the pass-gate, pull-up and pull-down transistors, respectively (706, see FIG. 9). While formation of only one of each of the first, second and third transistors is illustrated in FIGS. 9-17, those skilled in the art will recognize that to form the SRAM cell of FIG. 1, the wafer 800 should comprise multiple first and second regions 803, 804 and multiple fin shapes for each type transistor should be patterned. The pattern is formed with first fin shapes 908 and third fin shapes 904 above first semiconductor regions 803 (708) and second fin shapes 906 above second semiconductor regions 804 (710). Additionally, the pattern is formed with the third fin shape 904 wider (e.g., approximately 1.5 times wider) than the first fin shape and the second fin shape (712). Once the fin shapes are patterned, the image of the fin shapes 904, 906, 808 is transferred into the nitride layer 902, e.g., by a selective directional etch process (714). The sizes of the first fin shape 908, the second fin shape 906 and the third fin shape 904 can be reduced further (e.g., to less then current state of the art minimum lithographic dimensions) by etching back the nitride layer 902 below the mask layer a predetermined distance 1002 (e.g., by a chemical nitride removal process) (716, see FIG. 10). Then, the photo-resist layer is stripped.

Once the pattern is formed in the nitride layer 902, the pattern image can be transferred into the wafer by directionally etching the wafer (718). Specifically, the wafer 800 is etched past the buried oxide layer 806 into the substrate 802 below the second semiconductor region 804 (720, see FIG. 11). Thus, first and third semiconductor fins 1161, 1163 with the first crystalline orientation are formed, and a second semiconductor fin 1162 with the second crystalline orientation is also formed.

The fins shapes are each patterned with predetermined widths. Thus, when the etching process is performed to a predetermined depth, the third semiconductor fin is formed with a predetermined height-to-width ratio sufficient to partially deplete the channel of the subsequently formed third transistor (722). Similarly, when the etching process is performed, both the first semiconductor fin and the second semiconductor fin are either formed with a second height-to-width ratio that is sufficient to form a fully depleted fin-type field effect transistor or a third height-to-width ratio that is sufficient to form a fully depleted trigate field effect transistor (724-726).

Figure 12:
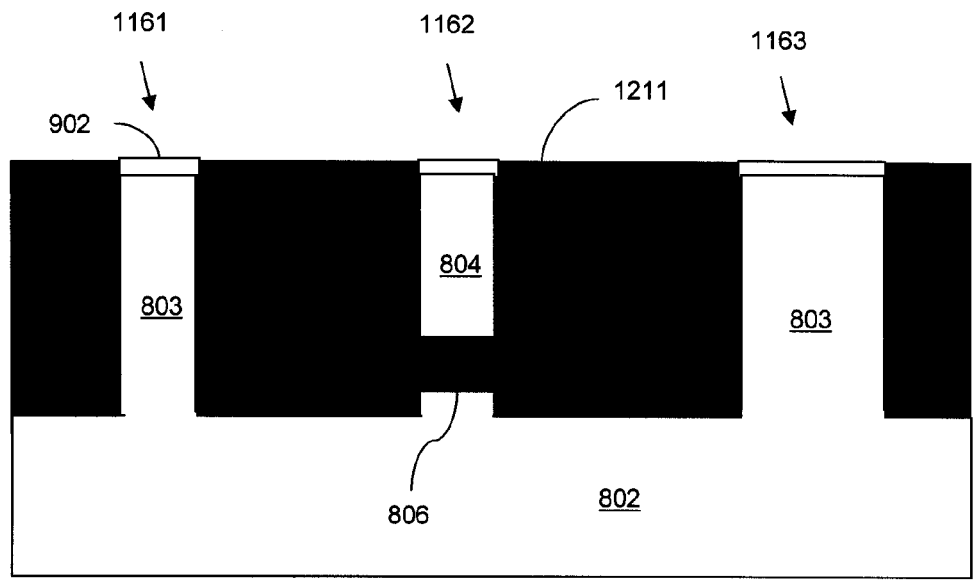
Figure 13:
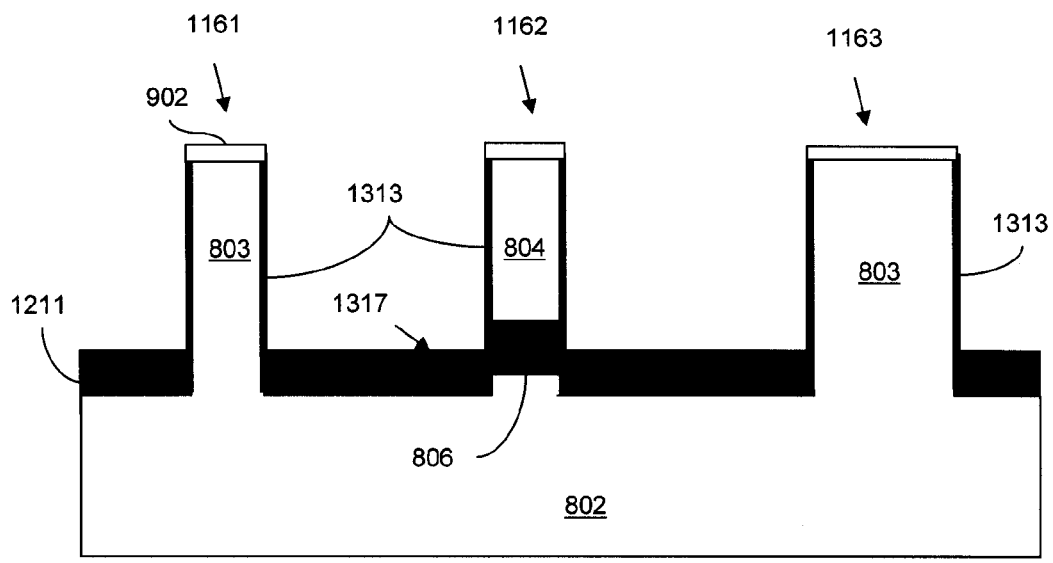
Figure 14:
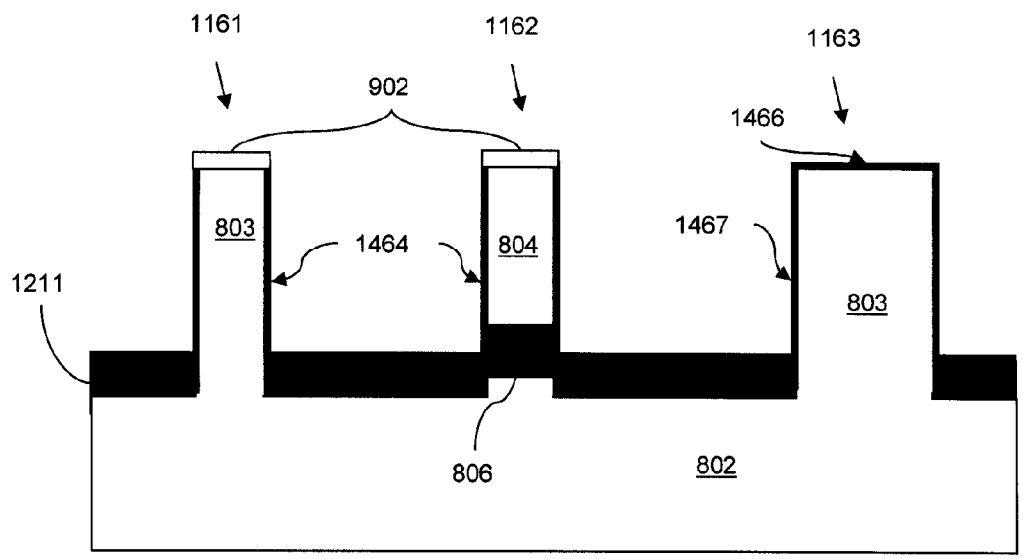
Figure 15:
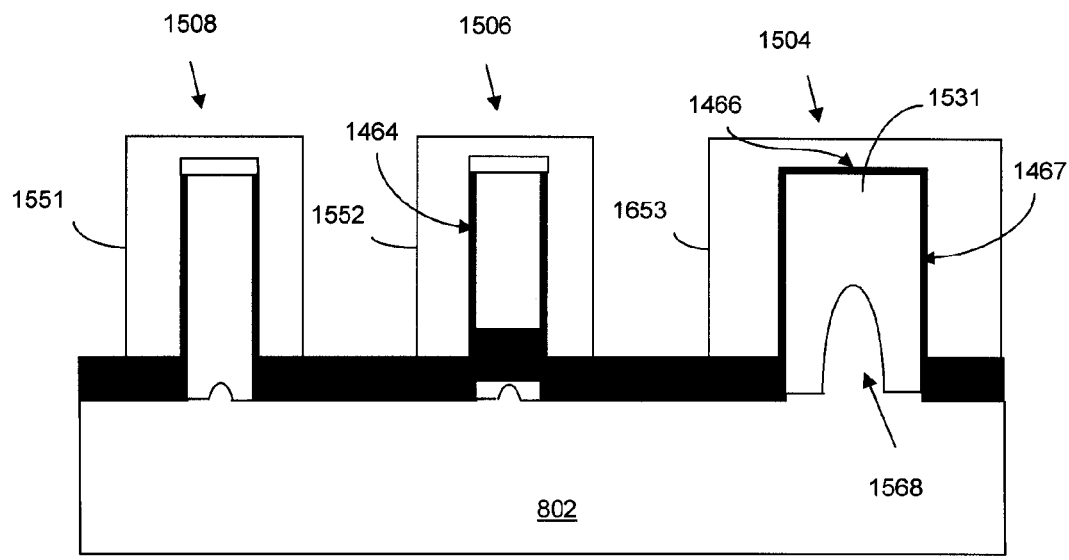

Once the fins are formed, an insulator layer 1211 (e.g., a dielectric layer such as SiO2) is deposited and planarized level with the nitride layer (728, see FIG. 12). The insulator layer 1211 is etched back such that its top surface 1317 is adjacent to the buried oxide layer 806 in the second semiconductor fin 1162 (e.g., between the top and bottom of the buried oxide layer 806) (730, see FIG. 13). Then, a sacrificial oxide layer 1313 can be grown on the sidewalls of all of the fins (732).

After forming the semiconductor fins, gates (including a gate dielectric layer and a gate electrode) are formed adjacent the fins. Specifically, depending on whether a finFET SRAM or a trigate SRAM is being formed, two or three first gates are formed adjacent the first semiconductor fin 1161, two or three second gates are formed adjacent the second semiconductor fin 1162, and three third gates are formed adjacent the third semiconductor fin 1163. For example, referring to FIGS. 14-15 and steps 734, 738 and 742, if the first and second semiconductor fins 1161-1162 will be used to form pass-gate and pull-up finFETs 1508 and 1506, the first and second fins 1161-1162 are masked and the nitride layer 902 is removed from the third fin 1163. The mask is stripped, leaving the nitride layer on the top surface of the first and second fins 1161-1162. A gate dielectric layer is then grown on all exposed semiconductor surfaces of all of the fins. After the gate dielectric layer is formed, a gate electrode (e.g., a doped polysilicon material) is deposited over the fins and patterned to form the first, second and third gates. Due to the remaining nitride layer on the top surface of the first and second fins, only two first gates 1551 and two second gates 1552 are formed adjacent the opposing sidewalls 1464 of the first and second semiconductor fins 1161 and 1162, respectively.

Figure 16:
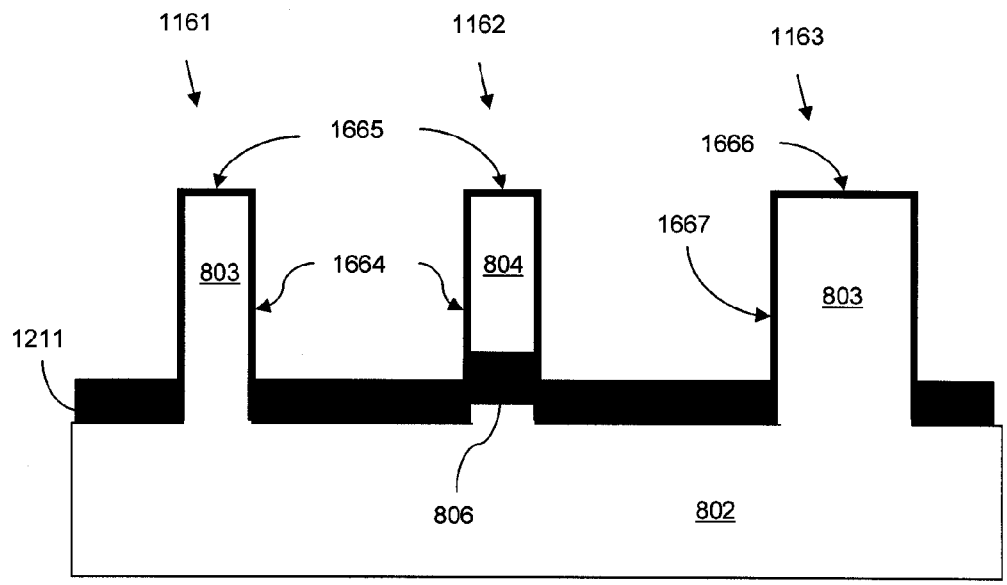
Figure 17:
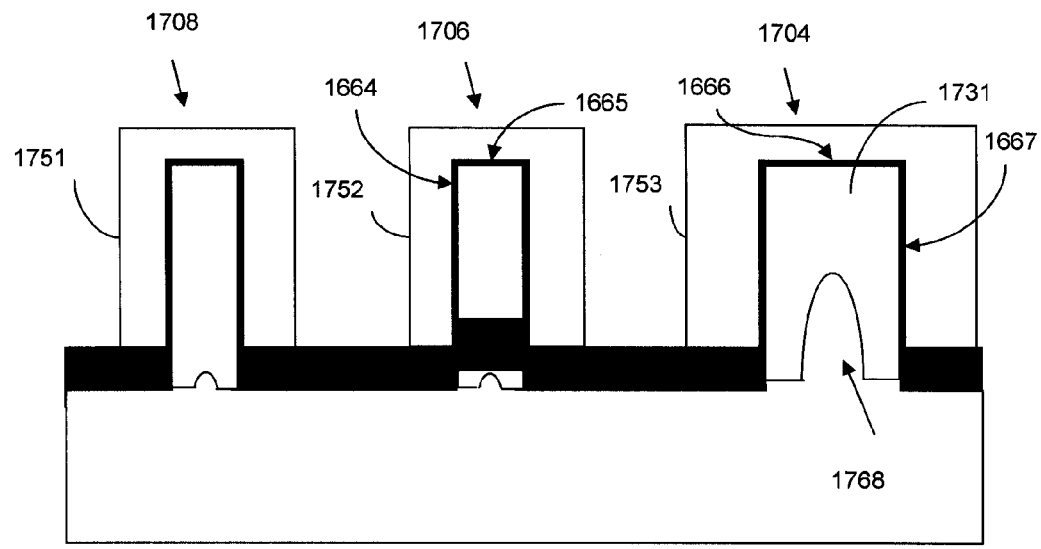

Alternatively, referring to FIGS. 16-17 and steps 736, 740, and 742, if the first and second semiconductor fins 1161-1162 will be used to form pass-gate and pull-up trigate FETs 1708 and 1706, the nitride layer 902 will be removed from all of the fins 1161-1163. A gate dielectric layer is grown on all exposed semiconductor surfaces of all of the fins. After the gate dielectric layer is formed, a gate electrode (e.g., a doped polysilicon material) is deposited over the fins and patterned to form the first 1751, second 1752 and third 1753 gates. Since the nitride layer was removed from all fins, the first 1751, second 1752 and third gates 1753 will be formed on the isolation layer 1211 adjacent to the opposing sidewalls 1464, 1467 of each of the fins and on the top surface 1465, 1466 of each of the fins (see FIG. 17). Thus, regardless of whether the pass-gate and pull-up FETs are finFETs 1508, 1506 or trigate FETs 1708, 1706, at least three third gates 1553, 1753 are formed adjacent to the third channel region 1531, 1731 of the third semiconductor fin: two gates on the isolation layer 1211 adjacent to the opposing sidewalls 1467 of the fin and one on the top surface 1466 of the fin.

When the third gates are patterned at step 742, they are patterned so that they are longer than the first gates and the second gates and, specifically, are formed with a predetermined length sufficient to achieve a predetermined fin width-to-gate length ratio so as to increase a drive current of the pull-down FETs (i.e., the third transistors) relative to that of the pull-up FETs (i.e., the second transistors) and the pass-gate FETs (i.e., the first transistors) (743).

As with the previously described method embodiments, once the gates are formed, additional processing may include forming source/drain extensions, forming halos, forming spacers, forming source/drain regions, depositing and planarizing a blanket dielectric layer, forming contacts to the gates, etc. (744). Additionally, contacts can be formed to p-wells below the channel of the pull-down transistors so that an electrical bias can be applied to the p-wells in order to further control the threshold voltages of the pull-down n-FETs and to further suppress short-channel effects.

Therefore, disclosed above is an SRAM cell on an SOI, bulk or HOT wafer with two pass-gate n-FETs, two pull-up p-FETs and two pull-down n-FETs and the associated methods of making the SRAM cell. The pass-gate FETs and pull-down FETs are non-planar fully depleted finFETs or trigate FETs. The pull-down FETs comprise non-planar partially depleted three-gated FETs having a greater channel width and a greater gate length and, thus, a greater drive current relative to the pass-gate and pull-up FETs. Additionally, for optimal electron mobility and hole mobility, respectively, the channels of the n-FETs and p-FETs can comprise semiconductors with different crystalline orientations.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the invention has been described in terms of embodiments, those skilled in the art will recognize that the invention can be practiced with modification within the spirit and scope of the appended claims.

What is claimed is:

1. A memory cell comprising:
 a first non-planar transistor comprising:
  a first semiconductor fin comprising a first channel; and
  first gates adjacent said first channel;
 a second non-planar transistor comprising:

a second semiconductor fin comprising a second channel; and
second gates adjacent said second channel; and
a third non-planar transistor comprising:
a third semiconductor fin comprising a third channel, having a top surface and opposing sidewalls; and
third gates adjacent said top surface and said opposing sidewalls, said third gates being longer than said first gates and said second gates,
wherein said first semiconductor fin, said second semiconductor fin and said third semiconductor fin each have approximately equal heights,
wherein said first semiconductor fin and said second semiconductor fin each have approximately equal widths such that said first channel and said second channel are fully depleted, and
wherein said third semiconductor fin is wider than said first semiconductor fin and said second semiconductor fin such that said third channel is only partially depleted.

2. The memory cell of claim 1, wherein said third transistor has a predetermined channel width-to-gate length ratio that is sufficient to suppress short-channel effects and to provide an increased drive current relative to that of said first transistor and said second transistor.

3. The memory cell of claim 1, wherein said first transistor and said second transistor comprise one of fully depleted fin-type field effect transistors and fully depleted trigate field effect transistors.

4. The memory cell of claim 1, wherein said first channel and said third channel comprise a semiconductor material with a first crystalline orientation, and wherein said second channel comprises said semiconductor material with a second crystalline orientation.

5. The memory cell of claim 1, further comprising one of a bulk wafer and a hybrid orientation wafer on which said first transistor, said second transistor and said third transistor are formed,
wherein said third transistor is a first-type transistor with a second-type semiconductor well below said third channel, and
wherein said second-type semiconductor well is adapted to receive an electrical bias so as to control a threshold voltage of said third transistor and further suppress said short-channel effects caused by said partially depleted third channel.

6. The memory cell of claim 1, wherein said third channel is approximately 1.5 times wider than said first channel and said second channel.

7. A memory cell comprising:
a non-planar pass-gate transistor comprising:
a first semiconductor fin comprising a first channel; and
first gates adjacent said first channel;
a non-planar pull-up transistor comprising:
a second semiconductor fin comprising a second channel; and
second gates adjacent said second channel; and
a non-planar pull-down transistor comprising:
a third semiconductor fin comprising a third channel, having a top surface and opposing sidewalls; and
third gates adjacent said top surface and said opposing sidewalls, said third gates being longer than said first gates and said second gates,
wherein said first semiconductor fin, said second semiconductor fin and said third semiconductor fin each have approximately equal heights,
wherein said first semiconductor fin and said second semiconductor fin each have approximately equal widths such that said first channel and said second channel are fully depleted, and
wherein third semiconductor fin is wider than said first semiconductor fin and said second semiconductor fin such that said third channel is only partially depleted.

8. The memory cell of claim 7, wherein said pull-down transistor has a predetermined channel width-to-gate length ratio that is sufficient to suppress short-channel effects and to provide an increased drive current relative to that of said pass-gate transistor and said pull-down transistor.

9. The memory cell of claim 7, wherein said pass-gate transistor and said pull-up transistor comprise one of fully depleted fin-type field effect transistors and fully depleted trigate field effect transistors.

10. The memory cell of claim 7, wherein said first channel and said third channel comprise a semiconductor material with a first crystalline orientation that is optimal for the mobility of electrons in an n-type transistor, and wherein said second channel comprises said semiconductor material with a second crystalline orientation that is optimal for the mobility of holes in a p-type transistor.

11. The memory cell of claim 7, further comprising one of a bulk wafer and a hybrid orientation wafer on which said pass-gate transistor, said pull-up transistor and said pull-down transistor are formed,
wherein said pull-down transistor comprises an n-type transistor with a p-type semiconductor well below said third channel, and
wherein said p-type semiconductor well is adapted to receive an electrical bias so as to control a threshold voltage of said n-type transistor and to suppress short-channel effects.

12. The memory cell of claim 7, wherein said third channel is approximately 1.5 times wider than said first channel and said second channel.

13. A memory cell comprising:
a non-planar pass-gate transistor comprising:
a first semiconductor fin comprising a first channel; and
first gates adjacent said first channel;
a non-planar pull-up transistor comprising:
a second semiconductor fin comprising a second channel; and
second gates adjacent said second channel; and
a non-planar pull-down transistor comprising:
a third semiconductor fin comprising a third channel, having a top surface and opposing sidewalls; and
third gates adjacent said top surface and said opposing sidewalls, said third gates being longer than said first gates and said second gates,
wherein said first semiconductor fin, said second semiconductor fin and said third semiconductor fin each have approximately equal heights,
wherein said first semiconductor fin and said second semiconductor fin each have approximately equal widths such that said first channel and said second channel are fully depleted, and
wherein third semiconductor fin is at least 1.5 times wider than said first semiconductor fin and said second semiconductor fin such that said third channel is only partially depleted.

14. The memory cell of claim 13, wherein said pull-down transistor has a predetermined channel width-to-gate length ratio that is sufficient to suppress short-channel effects and to provide an increased drive current relative to that of said pass-gate transistor and said pull-down transistor.

15. The memory cell of claim 13, wherein said pass-gate transistor and said pull-up transistor comprise one of fully depleted fin-type field effect transistors and fully depleted trigate field effect transistors.

16. The memory cell of claim 13, wherein said first channel and said third channel comprise a semiconductor material with a first crystalline orientation that is optimal for the mobility of electrons in an n-type transistor, and wherein said second channel comprises said semiconductor material with a second crystalline orientation that is optimal for the mobility of holes in a p-type transistor.

17. The memory cell of claim 13, further comprising one of a bulk wafer and a hybrid orientation wafer on which said pass-gate transistor, said pull-up transistor and said pull-down transistor are formed, wherein said pull-down transistor comprises an n-type transistor with a p-type semiconductor well below said third channel, and wherein said p-type semiconductor well is adapted to receive an electrical bias so as to control a threshold voltage of said n-type transistor and to suppress short-channel effects.

* * * * *